United States Patent [19]
Kawazoe et al.

[11] Patent Number: 5,327,441
[45] Date of Patent: Jul. 5, 1994

[54] METHOD AND CIRCUIT FOR DECODING CONVOLUTIONAL CODES

[75] Inventors: Katsuhiko Kawazoe, Yokohama; Shunji Honda; Shuji Kubota, both of Yokosuka; Shuzo Kato, Yokohama, all of Japan

[73] Assignee: Nippon Telegraph and Telephone Corporation, Tokyo, Japan

[21] Appl. No.: 991,215

[22] Filed: Dec. 15, 1992

[30] Foreign Application Priority Data

Dec. 16, 1991 [JP] Japan .................................. 3-331640

[51] Int. Cl.⁵ .......................................... G06F 11/10
[52] U.S. Cl. .............................................. 371/43
[58] Field of Search ................... 371/43, 37.1, 44, 45, 371/46

[56] References Cited
U.S. PATENT DOCUMENTS

| | | | |
|---|---|---|---|
| 4,159,469 | 6/1979 | Zdunek . | |
| 4,293,951 | 10/1981 | Rhodes | 371/43 |
| 4,532,638 | 7/1985 | Lagger et al. . | |
| 4,583,078 | 4/1986 | Shenoy et al. | 371/43 |
| 4,639,548 | 1/1987 | Oshima et al. | 371/46 |
| 4,757,506 | 7/1988 | Heichler | 371/43 |
| 4,809,277 | 2/1989 | Yano | 371/43 |
| 5,077,743 | 12/1991 | Bitzer et al. | 371/43 |
| 5,151,904 | 9/1992 | Reiner et al. | 371/43 |

OTHER PUBLICATIONS

Kuei-Ann Wen 'A new transform algorithm for viterbi decoding' pp. 764-771.
Sadig M. Sait 'A systolic algorithm for VLSI Design of a 1/n rate' pp. 307-309.

*Primary Examiner*—Robert W. Beausoliel, Jr.
*Assistant Examiner*—Albert Decady
*Attorney, Agent, or Firm*—Pollock, Vande Sande & Priddy

[57] ABSTRACT

In a simple decoder which decodes convolutional codes of constraint length K and coding rate n/m, encoded data which is supplied thereto in steps of m bits are distributed, bit by bit, to m shift registers each having $x = \lceil (K-1)/(m-n) \rceil$ series-connected shift stages. Here, $\lceil p \rceil$ means the minimum integer equal to or larger than a real number p. The connection of n modulo-2 addition circuits to all the shift stages of all the shift registers is defined by n decoding generative vectors which define n decoding generative polynomials. The modulo-2 addition circuits perform modulo-2 additions of the outputs of the shift stages connected thereto and output n results of additions as decoded results of n bits. The n decoding generative vectors are selected from decoding generative vectors of N rows which are obtained as an inverse matrix of a square matrix whose elements are N×N coefficients which define N=mx convolutional code generating polynomials.

14 Claims, 13 Drawing Sheets

FIG. 6

$$A = \begin{pmatrix}
1 & 1 & 0 & 1 & 1 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 1 & 1 & 0 & 1 & 0 & 0 & 0 & 0 & 0 & 0 & 0 & 0 & 0 & 0 & 0 & 0 & 0 & 0 & 0 & 0 & 0 & 0 \\
1 & 0 & 0 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 0 & 1 & 1 & 1 & 1 & 0 & 0 & 0 & 0 & 0 & 0 & 0 & 0 & 0 & 0 & 0 & 0 & 0 & 0 & 0 & 0 & 0 \\
0 & 0 & 0 & 1 & 1 & 0 & 1 & 1 & 0 & 1 & 0 & 0 & 0 & 0 & 0 & 0 & 0 & 0 & 0 & 0 & 0 & 0 & 0 & 0 & 0 & 0 \\
0 & 0 & 0 & 0 & 1 & 1 & 0 & 1 & 1 & 0 & 1 & 0 & 0 & 0 & 0 & 0 & 0 & 0 & 0 & 0 & 0 & 0 & 0 & 0 & 0 & 0 \\
0 & 0 & 0 & 1 & 0 & 0 & 1 & 1 & 1 & 1 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 0 & 0 & 1 & 1 & 1 & 1 & 0 & 0 & 0 & 0 & 0 & 0 & 0 & 0 & 0 & 0 & 0 & 0 & 0 & 0 \\
0 & 0 & 0 & 0 & 0 & 0 & 1 & 1 & 0 & 1 & 1 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 1 & 1 & 0 & 1 & 1 & 0 & 1 & 0 & 0 & 0 & 0 & 0 & 0 & 0 & 0 & 0 & 0 & 0 & 0 \\
0 & 0 & 0 & 0 & 0 & 0 & 1 & 0 & 0 & 1 & 1 & 1 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 1 & 0 & 0 & 1 & 1 & 1 & 1 & 0 & 0 & 0 & 0 & 0 & 0 & 0 & 0 & 0 & 0 & 0 \\
0 & 0 & 0 & 0 & 0 & 0 & 0 & 0 & 0 & 1 & 1 & 0 & 1 & 1 & 0 & 1 & 0 & 0 & 0 & 0 & 0 & 0 & 0 & 0 & 0 & 0 \\
0 & 0 & 0 & 0 & 0 & 0 & 0 & 0 & 0 & 0 & 1 & 1 & 0 & 1 & 1 & 0 & 1 & 0 & 0 & 0 & 0 & 0 & 0 & 0 & 0 & 0 \\
0 & 0 & 0 & 0 & 0 & 0 & 0 & 0 & 0 & 1 & 0 & 0 & 1 & 1 & 1 & 1 & 0 & 0 & 0 & 0 & 0 & 0 & 0 & 0 & 0 & 0 \\
0 & 0 & 0 & 0 & 0 & 0 & 0 & 0 & 0 & 0 & 0 & 1 & 0 & 0 & 1 & 1 & 1 & 1 & 0 & 0 & 0 & 0 & 0 & 0 & 0 & 0 \\
0 & 0 & 0 & 0 & 0 & 0 & 0 & 0 & 0 & 0 & 0 & 0 & 1 & 1 & 0 & 1 & 1 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 1 & 1 & 0 & 1 & 1 & 0 & 1 & 0 & 0 & 0 & 0 & 0 & 0 \\
0 & 0 & 0 & 0 & 0 & 0 & 0 & 0 & 0 & 0 & 0 & 0 & 1 & 0 & 0 & 1 & 1 & 1 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 1 & 1 & 1 & 1 & 0 & 0 & 0 & 0 & 0 \\
0 & 0 & 0 & 0 & 0 & 0 & 0 & 0 & 0 & 0 & 0 & 0 & 0 & 0 & 0 & 1 & 1 & 0 & 1 & 1 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 1 & 1 & 0 & 1 & 1 & 0 & 1 & 0 & 0 & 0 \\
0 & 0 & 0 & 0 & 0 & 0 & 0 & 0 & 0 & 0 & 0 & 0 & 0 & 0 & 0 & 1 & 0 & 0 & 1 & 1 & 1 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 1 & 1 & 1 & 1 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 1 & 1 & 1 & 1 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 1 & 1 & 1 & 1
\end{pmatrix}$$

FIG. 7

$$B=A^{-1}=\begin{pmatrix}
1 1 0 1 1 1 0 1 1 1 0 0 1 1 0 1 1 0 1 0 0 0 0 0 \\
1 0 1 0 0 0 0 1 0 0 0 1 0 1 1 1 1 0 1 0 0 0 0 0 \\
0 0 0 1 0 0 0 1 0 1 1 1 1 0 1 0 0 0 0 0 0 0 0 0 \\
0 0 0 0 1 1 0 1 1 1 0 1 1 1 0 0 1 1 0 1 1 0 1 0 \\
0 0 0 0 1 0 1 0 0 0 0 1 0 0 0 1 0 1 1 1 1 0 1 0 \\
0 0 0 0 0 0 0 1 0 0 0 1 0 1 1 1 1 0 1 0 0 0 0 0 \\
1 1 1 1 1 0 1 1 0 0 0 1 0 1 1 1 1 0 1 0 0 0 0 0 \\
1 1 1 1 1 0 1 1 0 1 1 0 1 0 1 1 0 1 1 1 1 0 1 0 \\
0 0 0 0 0 0 0 0 0 0 0 1 0 0 0 1 0 1 1 1 1 0 1 0 \\
0 0 0 0 1 1 1 1 1 0 1 1 0 0 0 1 0 1 1 1 1 0 1 0 \\
1 1 1 1 0 1 0 0 0 1 1 1 1 0 0 1 1 0 1 1 0 1 0 \\
1 1 1 1 1 0 1 1 1 1 0 0 1 0 1 1 0 1 1 1 1 0 1 0 \\
1 1 1 1 1 0 1 1 0 0 1 1 0 0 0 1 0 1 1 1 1 0 1 0 \\
1 1 1 1 0 1 0 0 1 0 0 0 1 1 0 1 1 0 1 0 0 0 0 0 \\
1 1 1 1 0 1 0 0 0 1 1 1 0 1 1 0 1 1 0 1 0 \\
1 1 1 1 0 1 0 0 0 1 1 1 1 0 0 1 0 1 1 1 1 0 1 0 \\
0 0 0 0 1 1 1 1 0 1 0 0 1 0 0 0 1 1 0 1 1 0 1 0 \\
1 1 1 1 0 1 0 0 1 0 0 0 1 1 0 1 0 0 0 0 0 0 0 0 \\
1 1 1 1 0 1 0 0 1 0 0 0 1 1 0 1 1 1 1 1 1 0 1 0 \\
1 1 1 1 1 0 1 1 0 0 1 1 1 1 0 1 1 1 0 0 0 0 0 \\
0 0 0 0 1 1 1 1 0 1 0 0 1 0 0 0 1 1 0 1 0 0 0 0 \\
1 1 1 1 0 1 0 0 1 0 0 0 0 0 1 0 1 0 1 1 0 0 1 0 \\
0 0 0 0 1 1 1 1 1 0 1 1 0 0 1 1 1 1 1 0 1 1 1 0 \\
0 0 0 0 0 0 0 0 1 1 1 1 0 1 0 0 1 0 0 0 1 1 0 1
\end{pmatrix}\begin{matrix}\}L_b\\\}L_c\\\\\\\\\\\\\\\\\\\\\\\\\\\\\\\\\}L_a\end{matrix}$$

FIG. 10

$$A = \begin{pmatrix}
1101101000000000000000000000000000000000000000 \\
0110110100000000000000000000000000000000000000 \\
0011011010000000000000000000000000000000000000 \\
0001101101000000000000000000000000000000000000 \\
0000110110100000000000000000000000000000000000 \\
1001111000000000000000000000000000000000000000 \\
0000100111100000000000000000000000000000000000 \\
0000001001111000000000000000000000000000000000 \\
0000000110110100000000000000000000000000000000 \\
0000000011011010000000000000000000000000000000 \\
0000000001101101000000000000000000000000000000 \\
0000000000110110100000000000000000000000000000 \\
0000000100111100000000000000000000000000000000 \\
0000000000100111100000000000000000000000000000 \\
0000000000001001111000000000000000000000000000 \\
0000000000000110110100000000000000000000000000 \\
0000000000000011011010000000000000000000000000 \\
0000000000000001101101000000000000000000000000 \\
0000000000000000110110100000000000000000000000 \\
0000000000000000011011010000000000000000000000 \\
0000000000000100111100000000000000000000000000 \\
0000000000000000100111100000000000000000000000 \\
0000000000000000001001111000000000000000000000 \\
0000000000000000000110110100000000000000000000 \\
0000000000000000000011011010000000000000000000 \\
0000000000000000000001101101000000000000000000 \\
0000000000000000000000110110100000000000000000 \\
0000000000000000000000011011010000000000000000 \\
0000000000000000000000110110100000000000000000 \\
0000000000000000000000100111100000000000000000 \\
0000000000000000000000010011110000000000000000 \\
0000000000000000000000001001111000000000000000 \\
0000000000000000000000000110110100000000000000 \\
0000000000000000000000000011011010000000000000 \\
0000000000000000000000000001101101000000000000 \\
0000000000000000000000000000110110100000000000 \\
0000000000000000000000000000100111100000000000 \\
0000000000000000000000000000010011110000000000 \\
0000000000000000000000000000001001111000000000 \\
0000000000000000000000000000000110110100000000 \\
0000000000000000000000000000000011011010000000 \\
0000000000000000000000000000000001101101000000 \\
0000000000000000000000000000000000110110100000 \\
0000000000000000000000000000000000011011010000 \\
0000000000000000000000000000000000001101101000 \\
0000000000000000000000000000000000000110110100 \\
0000000000000000000000000000000000000010011110 \\
0000000000000000000000000000000000000001001111 \\
0000000000000000000000000000000000000000100111
\end{pmatrix}$$

FIG. 11

$$B = A^{-1} =$$ (large binary matrix) with bracket labeled $L_a$

METHOD AND CIRCUIT FOR DECODING CONVOLUTIONAL CODES

BACKGROUND OF THE INVENTION

The present invention relates to a simple decoding method and a simple decoder circuit therefor which permit easy decoding of convolutional codes, but do not have error correcting capability by themselves, and which will hereinafter be called a simple decoding method and simple decoder, respectively.

Of presently known convolutional code decoding methods, a decoding algorithm proposed by A. J. Viterbi is regarded as a highly reliable decoding method with the highest error-correction capability and it has already been put into practical use as a Viterbi decoder in a limited field of satellite communications, proving its superiority over the prior art. The Viterbi decoder has excellent properties as mentioned above, but it is defective in that the circuit scale becomes very large to enhance the error correcting rate, resulting in an increase in power dissipation.

On the other hand, threshold decoding and sequential decoding have been proposed as error-correcting-and-decoding methods for convolutional codes. These decoding methods also call for large-scale circuitry, not as large as in the case of the Viterbi decoder, but still power dissipation is inevitably large. In view of such disadvantages of the prior art, an SST (Scarce State Transition) scheme has been proposed and put into practical use as a system which permits reduction of the power dissipation and circuit scale of the Viterbi decoder (Ishitani et al, "A Scarce-State-Transition Viterbi-Decoder VLSI for Error Correction", IEEE JOURNAL OF SOLID-STATE CIRCUITS, VOL. SC-22, No. 4, AUGUST 1987, pp 575-581).

FIG. 1 shows an example of an SST Viterbi decoder with a constraint length $K=7$ and a coding rate $R=\frac{1}{2}$, constructed through application of the SST scheme to a conventional Viterbi decoding circuit in a narrow sense which comprises branch metric circuits, ACS (Add-Compare-Select) circuits and path memory circuits as shown in the above-mentioned literature. In the SST Viterbi decoder, received convolutional codes $X_1$ and $X_2$ provided to terminals $11_1$ and $11_2$, which may include errors in the transmission channel, are decoded by a simple decoder 2 having no error-correcting capability to obtain estimated decoded data D' of original data D. The simple decoder shown in the literature and referred to as a pre-decoder is one that decodes one bit of the original data by a modulo-2 addition of code data from seven shift stages which are specified by a coupling vector (1110111010) and selected from 10-bit code data held in 10 shift stages. Then, the estimated decoded data D' is re-encoded by an encoder 3 of the same construction as that of a convolutional encoder at the transmitting side, and the re-encoded convolutional codes $X_1'$ and $X_2'$ are compared by comparators (exclusive-OR circuits) $13_1$ and $13_2$ with the received convolutional code data (soft decision data) $X_1$ and $X_2$, respectively.

If there are no errors in the transmission channel, the received code data $X_1$ and $X_2$ and the re-encoded data $X_1'$ and $X_2'$ match each other and the outputs from the comparators $13_1$ and $13_2$ both go to "0's." The convolutional code data $X_1$ and $X_2$ normally influence each other over a plurality of bits preceding and following them as the result of convolution of the original data, and therefore, when a channel error occurs, an abnormal bit pattern is produced which would be impossible with correct convolutional codes. On the other hand, regarding the output re-encoded data from the convolutional encoder 3, even if the input data D' includes an estimation error, no abnormal bit pattern will be introduced into the encoded data as the convolutional codes. Hence, when a channel error occurs, the comparators $13_1$ and $13_2$ provide "1's" continuously or discontinuously over a plurality of bits. The compared outputs representative of such an estimation error are provided to a conventional (i.e., narrow sense) Viterbi decoder 14 for decoding the estimation error. The decoded output from the narrow sense Viterbi decoder 14 and the decoded output D' from the simple decoder 2 are subjected to a modulo-2 addition by a modulo-2 addition circuit 15, thereby correcting the estimation error in the decoded output D' to obtain the original data D. Delay circuits $12_1$, $12_2$ and 16 are provided to time the data.

With such an SST Viterbi decoder, when no error is induced in the convolutionally encoded data in the transmission channel, the input to the narrow-sense Viterbi decoder 14 is always a "0." Therefore, the Viterbi decoder 14 processes only a code error. That is, data that is stored in the path memory circuits in the narrow-sense Viterbi decoder 14 is all "0" except when an error is induced in the transmitted signal, and the ON-OFF switching operation of gates rarely occurs in the path memory circuits. Since a CMOS circuit usually dissipates power by the ON-OFF switching of signals, power dissipation of the SST Viterbi decoder is far less than that of the conventional Viterbi decoder (about 40% when the bit error rate after Viterbi decoding, Pe, is 10). Moreover, the conventional Viterbi decoder employs a maximum likelihood decision circuit to reduce a required path memory length, but the Viterbi decoder utilizing the SST scheme permits reduction of the path memory length, and hence enables the omission of the maximum likelihood decision circuit. For these reasons, the SST Viterbi decoder affords reduction of the power dissipation and circuit scale or hardware size of the conventional Viterbi decoder 14.

FIG. 2 shows an example of the simplest construction of a convolutional encoder with coding rate $R=\frac{1}{2}$ and constraint length $K=4$ which is used at the transmission side in the prior art. In this example, the encoder is composed of a three-stage shift register 4 and modulo-2 addition circuits $5_1$ and $5_2$. The original data D ($D_1$, $D_2$, ...) are sequentially input into the shift register 4 via an input terminal 6 and the modulo-2 addition circuit $5_1$ performs modulo-2 addition of the outputs from all shift stages of the shift register 4, whereas the modulo-2 addition circuit $5_2$ performs modulo-2 addition of the outputs from first and third shift stages of the shift register 4. The modulo-2 addition circuits $5_1$ and $5_2$ output convolutionally encoded data $X_1$ and $X_2$ to terminals $7_1$ and $7_2$. The SST Viterbi decoder at the reception side, shown in FIG. 1, receives and decodes the encoded data $X_1$ and $X_2$. In the encoder of FIG. 2, since the outputs from the first and third stages of the shift register 4 are always provided to both modulo-2 addition circuits $5_1$ and $5_2$, the logical relationship of the data $X_1$ relative to the data $X_2$ is equivalent to that in the case where the data $X_2$ is set to a "0" and the output from the second shift stage is assumed to be the data $X_1$. It can readily be understood, therefore, that the simple decoder 2 in FIG. 1, which is the counterpart of the encoder in FIG. 2, can be formed by one modulo-2 addition circuit as depicted in FIG. 3. In this instance, the coupling vector which couples the input code data to the modulo-2 addition circuit is represented by (11).

It is desired, in general, that the coding rate R=n/m (where n is the number of input information bits and m is the number of output bits) be raised, that is, made closer to 1 so as to enhance the code transmission efficiency, and that the constraint length K be increased to improve the error-correcting capability. The simple decoder 2 that is needed in the SST Viterbi decoder can be implemented relatively easily when the coding rate R is ½ and the constraint length K is 7 or below, as referred to in the above-mentioned literature, but no logic design algorithm has been proposed for a simple decoder with an arbitrary coding rate R which is usually expressed by n/m. In fact, there are not available any simple decoders with coding rates R other than ½, except that the inventors of this application happened to succeed in implementing only a simple decoder with a coding rate R=¾ and constraint length K=7 after repeated trial and error (Kawazoe et al, "SST Type Viterbi Decoder for High Rate Convolutional Codes", Institute of Electronics and Communication Engineers of Japan, 1991 Autumn Convention, B-156). Thus it is difficult, with the prior art, to construct simple decoders for convolutional codes of arbitrary coding rates R other than those whose constraint lengths are 7 or shorter and whose coding rates are ½ and, therefore, it is difficult, in general, to construct the SST type Viterbi decoder which involves the use of such a simple decoder. On this account, decoding of codes with a coding rate R=n/m inevitably calls for the conventional Viterbi decoder which is not the SST type, and hence still suffers the aforementioned defect of large power dissipation.

SUMMARY OF THE INVENTION

It is therefore an object of the present invention to provide a simple decoding method for convolutional codes of an arbitrary constraint length and an arbitrary coding rate.

Another object of the present invention is to provide a simple decoder which utilizes the above-said decoding method.

According to the present invention, in a simple decoder for decoding convolutional codes of constraint length K and coding rate n/m (where K, n and m are natural numbers, K>1 and m>n), encoded data which is supplied every m bits to the decoder is distributed, bit by bit, to m shift registers, each having x=⌈(K−1)/(m−n)⌉ series-connected shift stages. Here, ⌈p⌉ means a minimum integer equal to or greater than a real number p. The connection of n modulo-2 addition circuits to all shift stages of all the shift registers is defined by n decoding generative vectors which define n decoding generative polynomials, and each modulo-2 addition circuit performs modulo-2 additions of outputs from the shift stages connected thereto and provides n added outputs as n-bit decoded results. The n decoding generative vectors each have, as coefficients, elements of n successive rows selected from elements of N rows which are obtained as an inverse matrix of a square matrix that has, as its elements, N×N coefficients which define generative polynomials for N=mx convolutional codes.

BRIEF DESCRIPTION OF THE DRAWINGS

FIG. 6 is a diagram showing a square matrix whose elements are coefficients of coding generative polynomials of the encoder depicted in FIG. 4;

FIG. 7 is a diagram showing an inverse matrix of the square matrix depicted in FIG. 6;

FIG. 10 is a diagram showing a square matrix whose elements are coefficients of coding generative polynomials with coding rate R=⅝ and constraint length K=7;

FIG. 11 is a diagram showing an inverse matrix of the square matrix depicted in FIG. 10;

DESCRIPTION OF THE PREFERRED EMBODIMENTS

Figure 4:
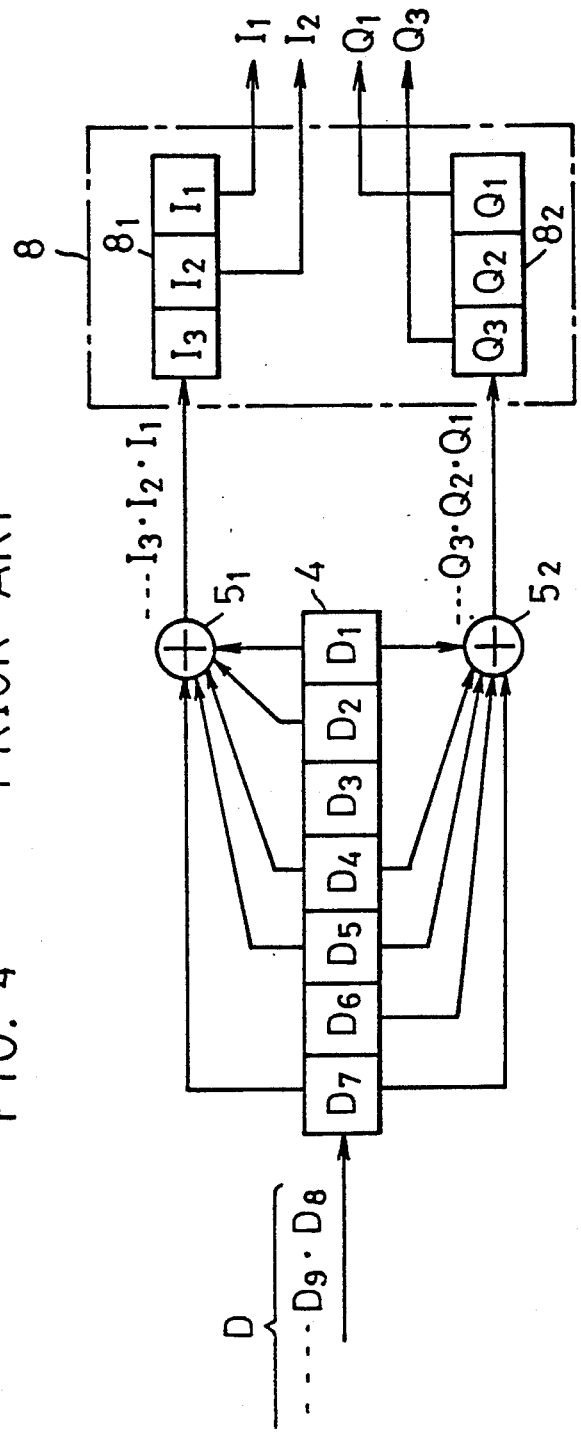
FIG. 4 is a diagram of a punctured type encoder with coding rate R=¾ and constraint length K=7.

To facilitate a better understanding of the present invention, a description will be given first of the generation of convolutional codes with coding rate n/m for which the simple decoder of the present invention is proposed. An encoder for generating convolutional codes with constraint length K and coding rate R=n/m is well-known in the art. FIG. 4 shows a punctured type encoder in the case where K=7, R=n/m=¾. In this instance, the encoder comprises a shift register 4 having seven shift stages, modulo-2 addition circuits $5_1$ and $5_2$ connected to predetermined ones of the seven shift stages, and a puncture circuit 8 composed of shift registers $8_1$ and $8_2$ which extracts data at predetermined m/2=2 bit positions from outputs of the modulo-2 addition circuits $5_1$ and $5_2$ every n=3 bits. The connection between the seven shift stages and each of the modulo-2 addition circuits $5_1$ and $5_2$ is expressed by coupling vectors which have seven coefficients 0 or 1 as elements. In the case of FIG. 4, the vectors are (1101101) and (1001101) and the coefficients "1" and "0" represent "connected" and "unconnected," respectively. The constraint length K corresponds to the number of stages from one end to the other of a plurality of shift stages connected to one modulo-2 addition circuit in accordance with the coefficient "1."

The connections between K shift stages and each of the modulo-2 addition circuits $5_1$ and $5_2$ are indicated by lines joining shift stages where coefficients (elements) of the coupling vectors correspond to "1" and each modulo-2 addition circuit. The coupling vector and the bit positions for extracting data by the puncture circuit 8 are so chosen as to maximize the error-correcting capability of convolutional codes to be generated. In this example, upon each 3-bit input of the original data D, 4-bit encoded data $I_1$, $I_2$, $Q_1$ and $Q_3$ are output. That is, when the pair of data $I_1$ and $Q_1$ are output from the modulo-2 addition circuits $5_1$ and $5_2$ in the state of original data $D_1$ to $D_7$ being held in all the shift stages of the shift register 4 and then data $D_8$ is input, the pair of data $I_2$ and $Q_2$ are output from the modulo-2 addition circuits $5_1$ and $5_2$. Thereafter, pairs of data $(I_3, Q_3)$, $(I_1, Q_1)$, $(I_2, Q_2)$ ... are similarly provided.

Upon each 3-bit input of paired data from the modulo-2 addition circuits $5_1$ and $5_2$ into each of the shift registers $8_1$ and $8_2$, the data $I_1$, $I_2$, $Q_1$, $Q_3$ are output, as a set of convolutional codes, from first and second bit positions of the shift register $8_1$ and first and third bit positions of the shift register $8_2$. Thus, to obtain one set of convolutional codes $(I_1, I_2, Q_1, Q_3)$ composed of four pieces of data, it is necessary that two more pieces of data $D_8$ and $D_9$ be input into the shift register 4 which is holding the original data $D_1$ to $D_7$. When these two pieces of data $D_8$ and $D_9$ are input, the data $D_3$ to $D_9$ are being held in the shift register 4 and the current pair of outputs $I_3$, $Q_3$ and the two preceding pairs of outputs $I_2$, $Q_2$ and $I_1$, $Q_1$ from the modulo-2 addition circuits $5_1$ and $5_2$ are being held in the shift registers $8_1$ and $8_2$. Then, it is possible to define two code generating vectors (each 9-bit) for generating the data $I_1$, $Q_1$ for 9-bit data $D_1$ to $D_9$, one code generating vector (9-bit) for generating the data $I_2$ and one code generating vector (9-bit) for generating the data $Q_3$.

Figure 5:
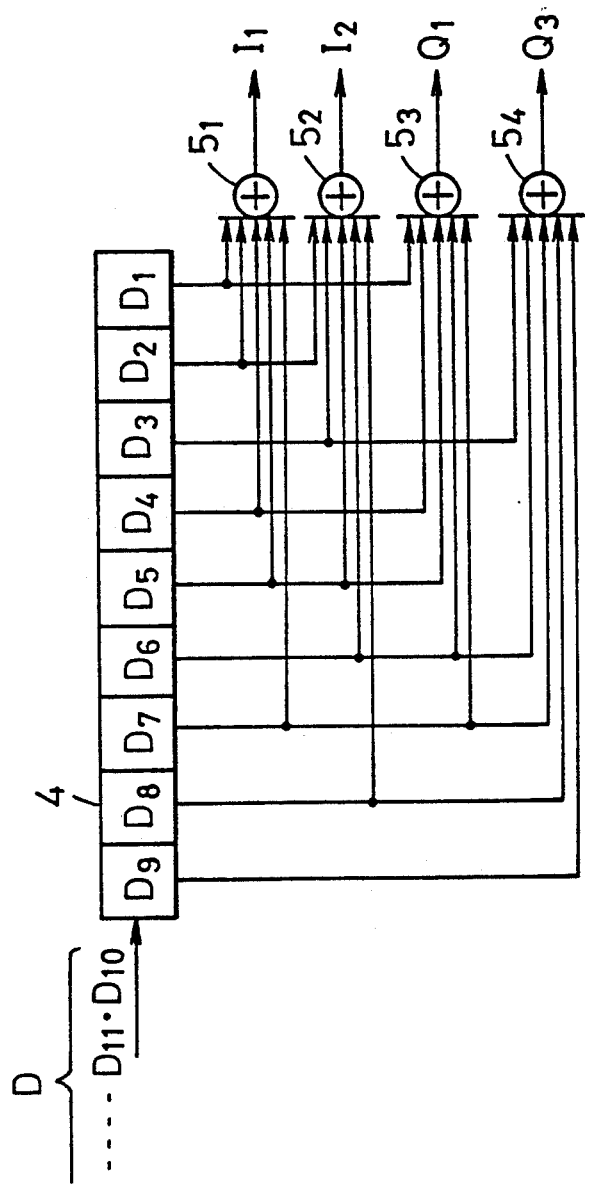
FIG. 5 is a diagram illustrating an example of a non-punctured type encoder which is a modified form of the encoder depicted in FIG. 4.

FIG. 5 illustrates an example of a non-punctured type convolutional encoder with constraint length K=7 and coding rate R=¾. The encoder of this example comprises a shift register 4 having nine shift stages and four modulo-2 addition circuits $5_1$ to $5_4$ each connected to predetermined ones of the nine shift stages in accordance with a corresponding one of four predetermined coupling vectors therefor. As is evident from the connections shown in FIG. 5, the connection between the modulo-2 addition circuit $5_2$ and the shift register 4 is shifted by one stage from the connection between the modulo-2 addition circuit $5_1$ and the shift register 4. Similarly, the connection between the modulo-2 addition circuit $5_4$ and the shift register 4 is shifted by two stages from the connection between the modulo-2 addition circuit $5_3$ and the shift register 4. Hence, the encoder of FIG. 5 is essentially identical with the encoder of FIG. 4. In either case, input data of nine consecutive bits is needed to obtain the 4-bit convolutional codes $I_1$, $I_2$, $Q_1$, $Q_3$ and upon each 3-bit addition of the original data D, the 4-bit $(I_1, I_2, Q_1, Q_3)$ convolutional code is output. Therefore, the four code generating vectors (each 9-bit) for generating these 4-bit code data are the same as the above-mentioned four coupling vectors, and they are identical with the four code generating vectors in the case of FIG. 4. In general, in the case of constraint K and coding rate n/m, input data of consecutive K+n−1 bits is needed to obtain an m-bit convolutional code, and each time further input data D is added by n bits, it is possible to define n generating vectors each of K+n−1 bits for obtaining the m-bit convolutional code.

In the examples of FIGS. 4 and 5, the first set of encoded data $I_1^1$, $I_2^1$, $Q_1^1$, $Q_3^1$ can be expressed by the following expressions, using the 9-bit original data $D_1$ to $D_9$.

$$I_1^1 = D_1 + D_2 + D_4 + D_5 + D_7 \qquad (1)$$

$$I_2^1 = D_2 + D_3 + D_5 + D_6 + D_8$$

$$Q_1^1 = D_1 + D_4 + D_5 + D_6 + D_7$$

$$Q_3^1 = D_3 + D_6 + D_7 + D_8 + D_9$$

In the above, the symbol "+" represents a modulo-2 addition (an exclusive-OR). As referred to previously, the inventors of this application happened to succeed in implementing only one simple decoder with no error-correcting capability which can be used at the receiving side to decode the original data $D_1$ to $D_9$ from the received convolutionally encoded data $I_1$, $I_2$, $Q_1$, $Q_3$ with constraint length K=7 and coding rate R=¾, but it is very difficult to construct a simple decoder by which convolutional codes with constraint length K and coding rate R=n/m can be decoded without using the Viterbi decoding algorithm.

Incidentally, another set of encoded data $I_1^2$, $I_2^2$, $Q_1^2$, $Q_3^2$ which are obtained from the encoder when 3-bit original data $D_{10}$, $D_{11}$ and $D_{12}$ are further input into the encoder of FIG. 4 or 5 which is in the state represented by Ex. (1), are expressed as follows:

$$I_1^2 = D_4 + D_5 + D_7 + D_8 + D_{10} \qquad (2)$$

$$I_2^2 = D_5 + D_6 + D_8 + D_9 + D_{11}$$

$$Q_1^2 = D_4 + D_7 + D_8 + D_9 + D_{10}$$

$$Q_3^2 = D_5 + D_9 + D_{10} + D_{11} + D_{12}$$

Ex. (1) provides one set of four polynomials which determine one set of four modulo-2 added values $I_1^1$, $I_2^1$, $Q_1^1$, $Q_3^1$ using nine variables $D_1$ to $D_9$, whereas Ex. (2) provides four further polynomials which determine four modulo-2 added values using the nine variables plus three new variables $D_{10}$ to $D_{12}$. Thus, the number of polynomials increases by four each time the original data D is input by three bits. By repeating such an operation, the number of polynomials obtained at a certain point of time is equal to or greater than the t number of variables $D_1, D_2, \ldots$ used. For example, in the above-noted case of K=7 and n/m=¾, if the number of polynomials is greater than the number of variable data D at the time point when a total of x sets of polynomials are obtained, then the following expression holds:

$$4x \geq 9 + 3(x-1) \qquad (3)$$

Then, the value of the minimum integer x that satisfies Ex. (3) is x=3 and 24 polynomials including 24 variables $D_1$ to $D_{24}$ are obtained. Conversely speaking, this means that the variables $D_1$ to $D_{24}$ can be determined when 24 (or six sets of) modulo-2 added values $(I_1^1, I_2^1, Q_1^1, Q_3^1), (I_1^2, I_2^2, Q_1^2, Q_3^2), \ldots, (I_1^6, I_2^6, Q_1^6, Q_3^6)$, which are convolutionally encoded data, are provided. Hence, by providing in the simple decoder at the receiving side a shift register capable of holding 24 pieces of received encoded data, the original data of 24 bits $D_1$ to $D_{24}$ can be obtained from the 24 pieces of received data, that is, six sets of received convolutional codes in such a manner as described below.

The above-mentioned 24 polynomials are expressed as the following code generating polynomials, using a coefficient $a_{i,j}$ (where $a_{i,j}$ is 0 or 1, $i=1$ to 24 and $j=1$ to 24).

$$I_1^1 = a_{1,1}D_1 + a_{1,2}D_2 + \ldots + a_{1,24}D_{24} \quad (4)$$

$$I_2^1 = a_{2,1}D_1 + a_{2,2}D_2 + \ldots + a_{2,24}D_{24}$$

$$Q_1^1 = a_{3,1}D_1 + a_{3,2}D_2 + \ldots + a_{3,24}D_{24}$$

$$Q_3^1 = a_{4,1}D_1 + a_{4,2}D_2 + \ldots + a_{4,24}D_{24}$$

$$\vdots$$

$$I_1^6 = a_{21,1}D_1 + a_{21,2}D_2 + \ldots + a_{21,24}D_{24}$$

$$I_2^6 = a_{22,1}D_1 + a_{22,2}D_2 + \ldots + a_{22,24}D_{24}$$

$$Q_1^6 = a_{23,1}D_1 + a_{23,2}D_2 + \ldots + a_{23,24}D_{24}$$

$$Q_3^6 = a_{24,1}D_1 + a_{24,2}D_2 + \ldots + a_{24,24}D_{24}$$

Referring now to Exs. (1) and (2), $a_{1,1}=1$, $a_{1,2}=1$, $a_{1,3}=0$, $a_{1,4}=1$, $a_{1,5}=1$, $a_{1,6}=0$, $a_{1,7}=1$, and it is evident that $a_{i,j}=0$ for $8 \leq j \leq 24$. Likewise, all the other coefficients are determined. FIG. 6 shows a square matrix A whose elements are coefficients $a_{i,j}$ of all polynomials. The matrix A represents a convolutional code generating matrix of the encoder shown in FIG. 4 or 5. As will be seen from FIG. 6, for example, coefficients $a_{1,1}$ to $a_{4,9}$ of four rows and nine columns indicate coefficients for the connection between, for instance, the four modulo-2 addition circuits $5_1$ to $5_4$ and the nine shift stages of the shift register 4 in FIG. 5. In this way, all the coefficients $a_{i,j}$ are predetermined in accordance with the construction of the encoder depicted in FIG. 4 or 5. Hence, if an inverse matrix of the square matrix A which uses as its elements the coefficients $a_{i,j}$ of Ex. (4) is obtained, then the original data $D_1$ to $D_{24}$ can be obtained by the following expression.

$$D_1 = b_{1,1}I_1^1 + b_{1,2}I_2^1 + b_{1,3}Q_1^1 + \ldots + b_{1,24}Q_3^6 \quad (5)$$

$$D_2 = b_{2,1}I_1^1 + b_{2,2}I_2^1 + b_{2,3}Q_1^1 + \ldots + b_{2,24}Q_3^6$$

$$\vdots$$

$$D_{24} = b_{24,1}I_1^1 + b_{24,2}I_2^1 + b_{24,3}Q_1^1 + \ldots + b_{24,24}Q_3^6$$

In the above, $b_{i,j}$ (where $i=1$ to 24 and $j=1$ to 24) is an element of a square matrix B and is "1" or "0." Ex. (5) is called a decoding generative polynomial in this specification.

The inverse matrix of the square matrix A shown in FIG. 6 can easily be calculated, and the results of calculation are shown in FIG. 7. The matrix B represents an original data decoding generative polynomial. As will be evident from the foregoing description, in the case of decoding the convolutional codes with coding rate $R=\frac{3}{4}$, 3-bit original data is obtained every 4-bit received encoded data. In the matrix B of FIG. 7, three consecutive rows starting at an arbitrary row provide coefficient solutions of three decoding generative polynomials whereby original data of three bits is determined from convolutional codes generated by the encoder of FIG. 4 or 5 which performs convolutional encoding in accordance with the code generating matrix depicted in FIG. 6, and a decoder can be formed by using coefficients of any three consecutive rows of the matrix B.

Figure 8:
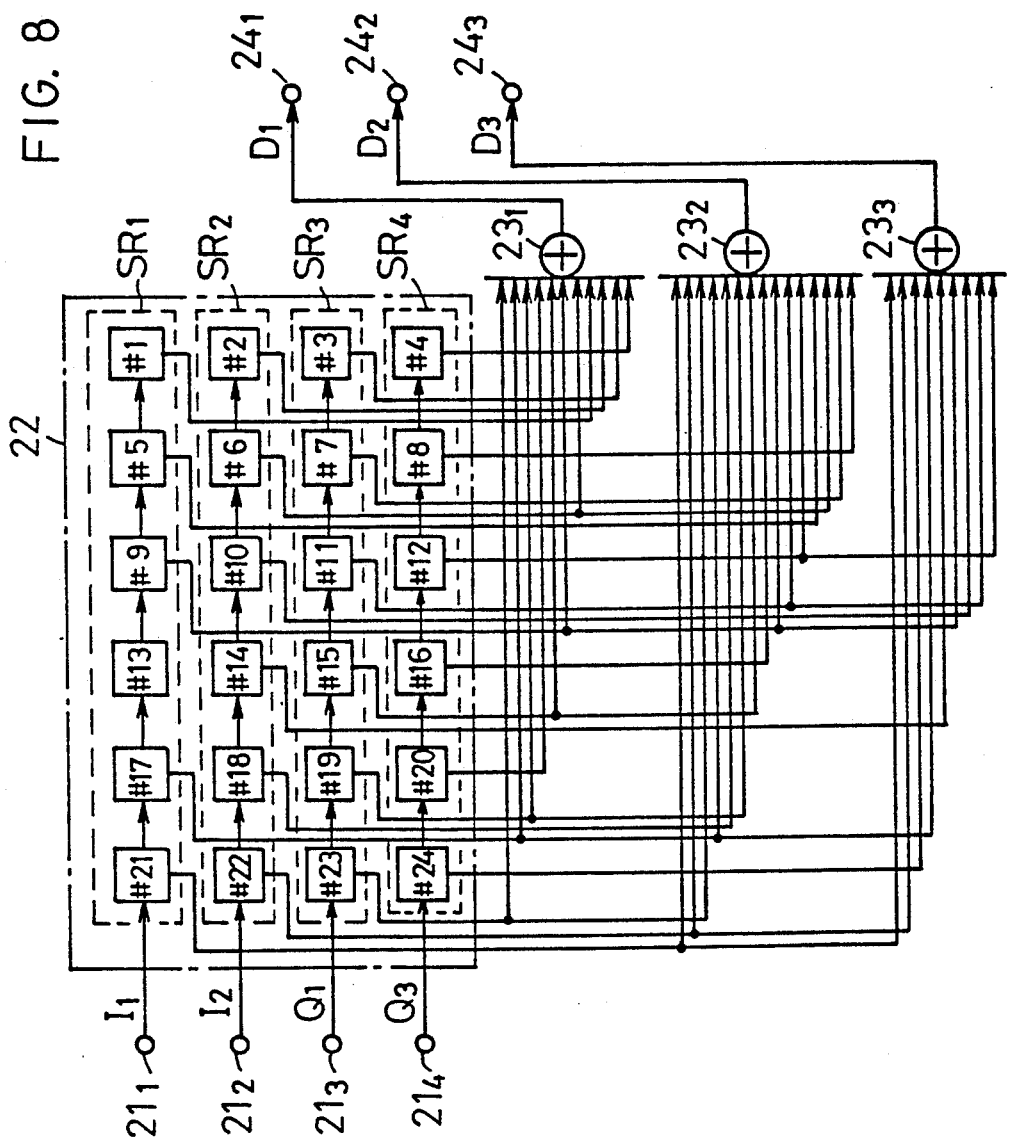
FIG. 8 is a circuit diagram illustrating an embodiment of a simple decoder according to the present invention constructed in accordance with coefficients of decoding generative polynomials obtained from the inverse matrix shown in FIG. 7.

FIG. 8 illustrates an embodiment of the simple decoder according to the present invention which is constructed using coefficients of a group of the lowest three rows indicated by $L_a$ in FIG. 7. In this case, the codes to be decoded are convolutional codes of constraint length $K=7$ and coding rate $R=\frac{3}{4}$ which are produced by the encoder of FIG. 4 or 5. In this embodiment, 24 shifts stages #1 to #24 necessary for holding received encoded data of 24 bits are arranged in the form of a matrix with 4 rows and 6 columns. Six shift stages of respective rows are connected in series to form four shift registers $SR_1$ to $SR_4$, which constitute a shift register circuit 22. In the state in which the 24 shift stages are all filled with data by repeatedly inputting each of the input encoded data $I_1$, $I_2$, $Q_1$, $Q_3$, which are provided for every four bits, into the corresponding one of input terminals $21_1$ to $21_4$ of the four shift registers $SR_1$ to $SR_4$, the earliest or oldest data is stored in the shift stage in the first row, sixth column (at the upper right-hand corner) and the latest or most recent data is stored in the shift stage in the fourth row, first column (lower left-hand corner). In FIG. 8 the shift stages, which are holding the 24 pieces of data from the earliest to the latest one, respectively, are therefore indicated by numbers #1 to #24 in a sequential order.

The decoder of FIG. 8 further includes three modulo-2 addition circuits $23_1$, $23_2$ and $23_3$ which output decoded results in parallel in units of three bits. The 24 coefficients arranged from left to right in the first row of the row group $L_a$ in FIG. 7 represent the state of connection between the 24 shift stages #1 to #24 and the modulo-2 addition circuit $23_1$, and outputs of the shift stages #1 to #4, #6, #9, #15, #17, #19, #20 and #23, which correspond to the positions of the coefficients "1," are selected and subjected to the modulo-2 addition by the modulo-2 addition circuit $23_1$. Similarly, 24 coefficients in the second row of the row group $L_a$ represent the state of connection between the 24 shift stages #1 to #24 and the modulo-2 addition circuit $23_2$, and the outputs of the shift stages #5 to #9, #11, #12, #15 to #19, and #21 to #23, which correspond to the positions of the coefficients "1," are selected and subjected to the modulo-2 addition by the modulo-2 addition circuit $23_2$. Also 24 coefficients in the third row of the row group $L_a$ represent the state of connection between the 24 shift stages #1 to #24 and the modulo-2 addition circuit $23_3$, and the outputs of the shift stages #9 to #12, #14, #17, #21, #22 and #24, which correspond to the positions of the coefficients "1," are selected and subjected to the modulo-2 addition by the modulo-2 addition circuit $23_3$.

The outputs that are provided from the modulo-2 addition circuits $23_1$ to $23_3$ while the first 24 encoded data are being held in the shift register circuit 22 are original data $D_1$, $D_2$, $D_3$. Thereafter, upon each input of the data of four bits $I_1$, $I_2$, $Q_1$, $Q_3$ into the shift register circuit 22, data $D_4$, $D_5$, $D_6$, ... are provided at output terminals $24_1$, $24_2$ and $24_3$ in units of three bits.

As described previously, the row group $L_a$ is a set of coefficient solutions for determining the generating polynomials which enable decoding of convolutional codes, and similarly, any other row groups of arbitrary three consecutive rows are also coefficient solutions which permit decoding of convolutional codes. Simple decoders similar to that shown in FIG. 8 can be constructed by connecting the 24 shift stages #1 to #24 to the three modulo-2 addition circuits $23_1$ to $23_3$ in accordance with the coefficients in respective three consecutive rows. In the case of constructing a simple decoder by use of the uppermost three rows indicated by $L_b$ in FIG. 7, the coefficients at the rightmost four bit positions of the row group $L_b$ are all "0's" as shown and the shift stages corresponding to these four bit positions are not connected to any of the three modulo-2 addition circuits $23_1$, $23_2$ and $23_3$. Accordingly, these shift stages can be omitted, in which case the shift register circuit 22 becomes such one with 4 rows and 5 columns, omitting the shift stages #21 to #24. This circuit corresponds to the simple decoder disclosed in the aforementioned literature, that is, the simple decoder that the inventors of this application succeeded in implementing through trial and error.

A row group $L_c$ is equivalent to a modified version of the row group $L_b$ wherein the coefficients "0's" at the rightmost bit positions have all been shifted to the leftmost positions. Since the shift stages corresponding to these four bit positions can similarly be omitted, the simple decoder in this case is exactly identical in construction with the simple decoder constructed in accordance with the row group $L_b$. Thus, the shift register circuit 22 of the simple decoder into which the convolutional codes of constraint length $K=7$ and coding rate $R=\frac{3}{4}$ are input in parallel every four bits is usually such one with 4 rows and 6 columns, but a set of coefficient solutions which permit omission of one or more shift stages may sometimes be obtained as in the case of FIG. 7. Moreover, there are some shift stages which are not connected to any one of the modulo-2 addition circuits but are used only to preserve the timing relation between pieces of data, such as the shift stage #13 in FIG. 8.

Figure 9:
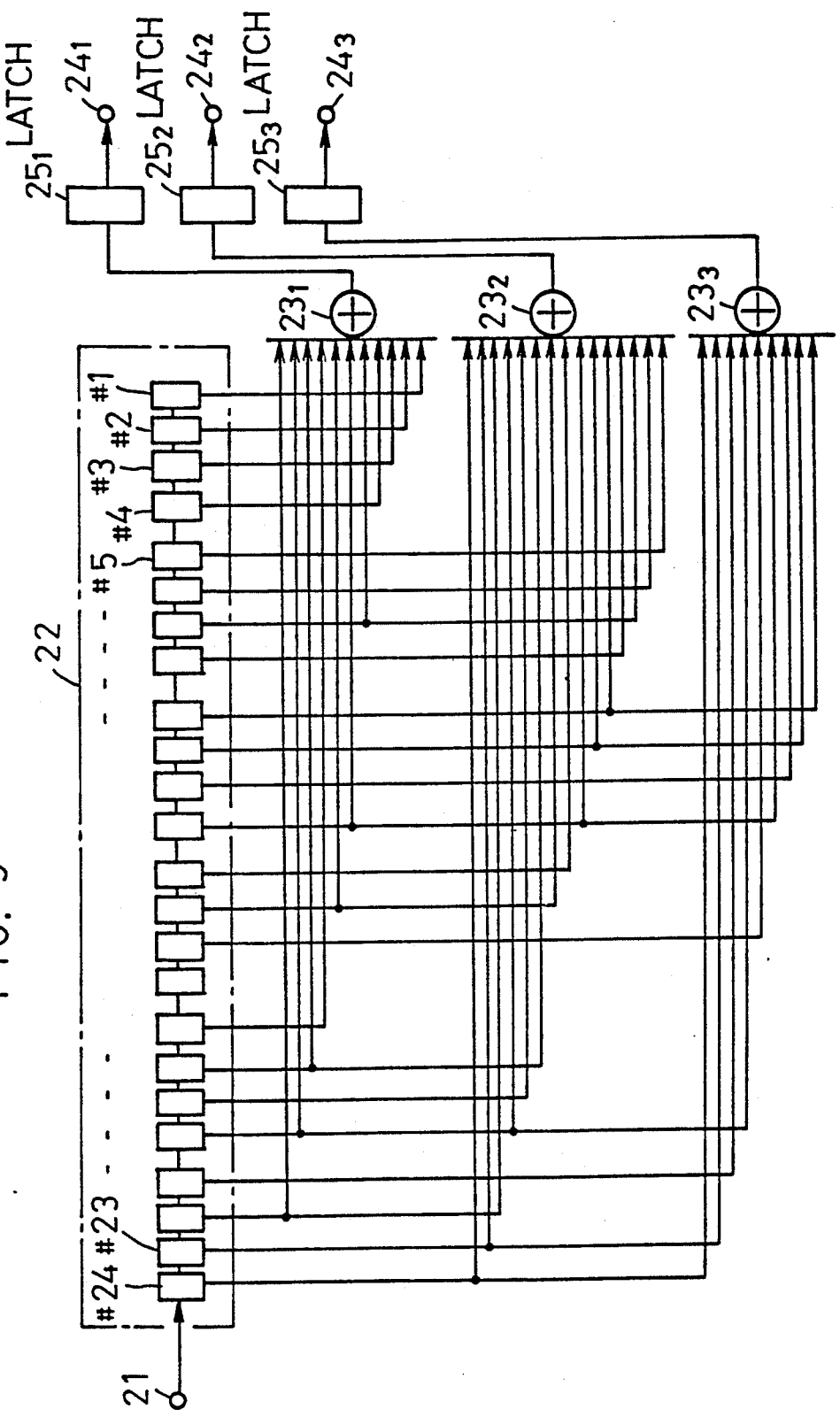
FIG. 9 is a circuit diagram illustrating a modified form of the simple decoder shown in FIG. 8.

While the FIG. 8 embodiment is the simple decoder into which convolutionally encoded data are input in parallel every four bits, FIG. 9 illustrates a simple decoder of the type wherein convolutional codes are input serially, constructed in accordance with the row group $L_a$ which is a set of coefficient solutions expressed by the inverse matrix of FIG. 7 as in the case of FIG. 8. In this embodiment the 24 shift stages #1 to #24, which constitute the shift register circuit 22, are all connected in series, and as in the case of FIG. 8, the shift stages and the three modulo-2 addition circuits $23_1$ to $23_3$ are connected in accordance with the coefficients of the row group $L_a$ in the inverse matrix of FIG. 7. The input coded data are repeatedly input into the shift register circuit 22 in the order $I_1$ - $I_2$ - $Q_1$ - $Q_3$, and the outputs from the modulo-2 addition circuits $23_1$, $23_2$ and $23_3$, obtained in the state in which the shift stages #1 to #24 are all filled with data for the first time, are fetched into latches $25_1$, $25_2$ and $25_3$ and thence to the output terminals $24_1$, $24_2$ and $24_3$. Thereafter, upon each input of encoded data of four bits $I_1$, $I_2$, $Q_1$, $Q_3$ into the shift register circuit 22, decoded data of three bits are fetched from the modulo-2 addition circuits $23_1$, $23_2$ and $23_3$ into the latches $25_1$, $25_2$ and $25_3$.

While the foregoing description has been given of examples of simple decoders for convolutional codes with constraint length $K=7$ and coding rate $R=n/m=\frac{3}{4}$, a brief description will be given of the procedure for forming a simple decoder for convolutional codes with constraint length $K=7$ but coding rate $R=n/m=\frac{7}{8}$. Now, let it be assumed that convolutionally encoded data of the first 8 bits $I_1$, $I_2$, $I_3$, $I_4$, $I_6$, $Q_1$, $Q_5$ and $Q_7$ are generated by an encoder based on the following code generating polynomials, through use of original data of the first 13 bits $D_1$ to $D_{13}$.

$$I_1^1 = D_1 + D_2 + D_4 + D_5 + D_7 \tag{6}$$
$$I_2^1 = D_2 + D_3 + D_5 + D_6 + D_8$$
$$I_3^1 = D_3 + D_4 + D_6 + D_7 + D_9$$
$$I_4^1 = D_4 + D_5 + D_7 + D_8 + D_{10}$$
$$I_6^1 = D_6 + D_7 + D_9 + D_{10} + D_{12}$$
$$Q_1^1 = D_1 + D_4 + D_5 + D_6 + D_7$$
$$Q_5^1 = D_5 + D_8 + D_9 + D_{10} + D_{11}$$
$$Q_7^1 = D_7 + D_{10} + D_{11} + D_{12} + D_{13}$$

When original data of the next seven bits $D_{14}$ to $D_{20}$ are input into the encoder, one set of encoded data of the next eight bits are obtained by the following expression which is obtained by a 7-bit shift of all the data in the above expression.

$$I_1^2 = D_8 + D_9 + D_{11} + D_{12} + D_{14} \tag{7}$$
$$I_2^2 = D_9 + D_{10} + D_{12} + D_{13} + D_{15}$$
$$I_3^2 = D_{10} + D_{11} + D_{13} + D_{14} + D_{16}$$
$$I_4^2 = D_{11} + D_{12} + D_{14} + D_{15} + D_{17}$$
$$I_6^2 = D_{13} + D_{14} + D_{16} + D_{17} + D_{19}$$
$$Q_1^2 = D_8 + D_{11} + D_{12} + D_{13} + D_{14}$$
$$Q_5^2 = D_{12} + D_{15} + D_{16} + D_{17} + D_{18}$$
$$Q_7^2 = D_{14} + D_{17} + D_{18} + D_{19} + D_{20}$$

Each time the original data is input into the encoder by seven bits, encoded data of eight bits is provided. Hence, if the number of code generating polynomials (the number of all encoded data) obtained after repeating the generation of the 8-bit encoded data x·times is equal to or greater than the number of original data input so far, $8x \geq 13 + 7(x-1)$ holds and, therefore, the minimum value of x is $x=6$. By representing $8x=48$ pieces of encoded data obtainable at this time by coefficients $a_{i,j}$ (wherein $i=1$ to 48 and $j=1$ to 48) of code generating polynomials, these coefficients $a_{i,j}$ can be expressed by a square matrix A shown in FIG. 10 through use of Exs. (6) and (7). Since the coefficients of the 48 code generating polynomials are thus determined, it is possible to determine 48 pieces of original data when 48 pieces of encoded data are provided, and coefficients $b_{i,j}$ (where $i=1$ to 48 and $j=1$ to 48) of decoding generative polynomials for generating the original data are provided by an inverse matrix $B=A^{-1}$ of the square matrix shown in FIG. 10, calculated results of the inverse matrix B being shown in FIG. 11. Thus, by providing the simple decoder with a shift register circuit which has a required number of shift stages for storing input convolutionally encoded data of $8x=48$ bits, it is possible to decode the 7-bit original data from newly input 8-bit encoded data and the preceding 40-bit encoded data by use of seven decoding generative polynomials of the coefficients determined in FIG. 11.

Figure 11:
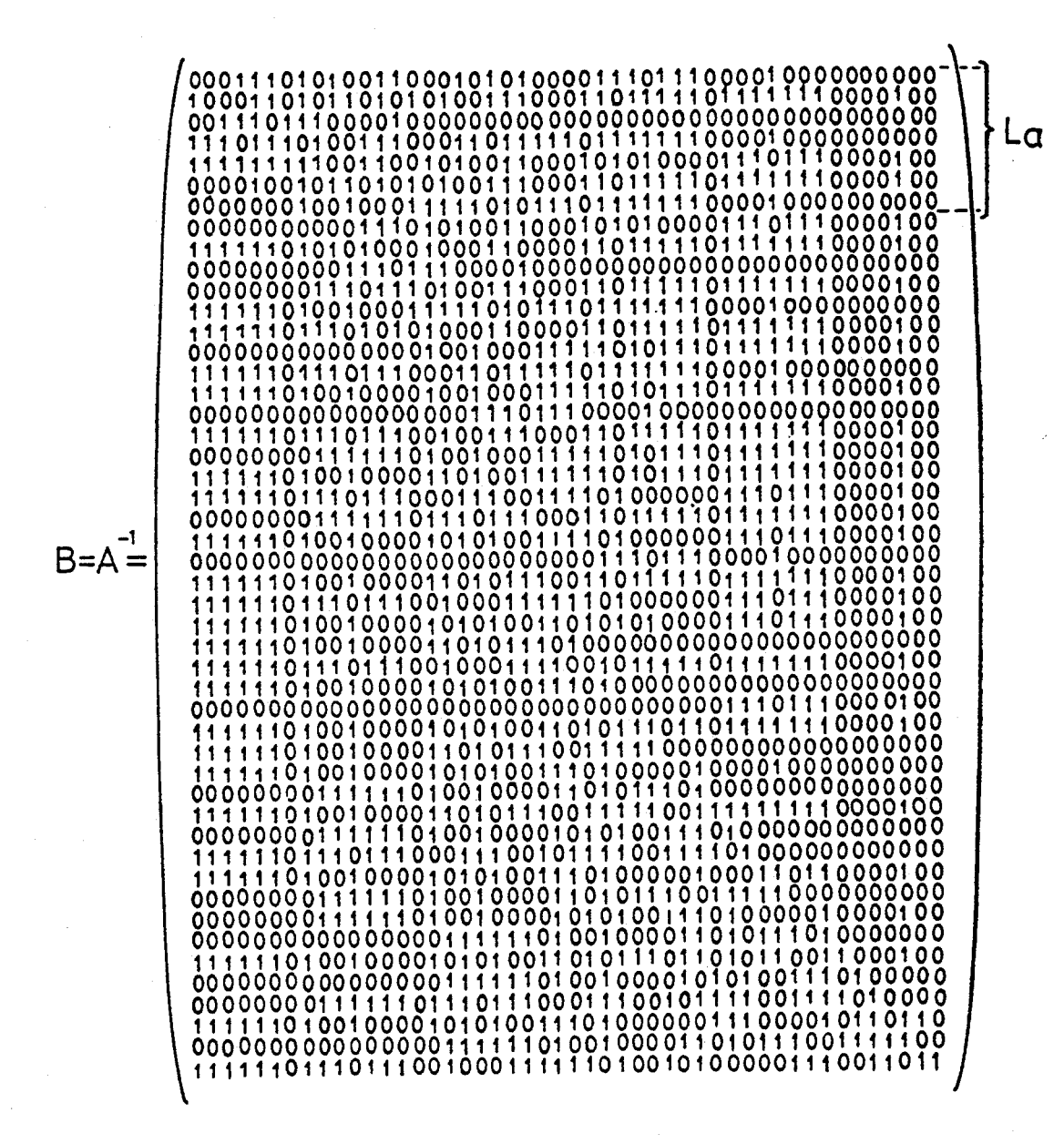
Figure 12:
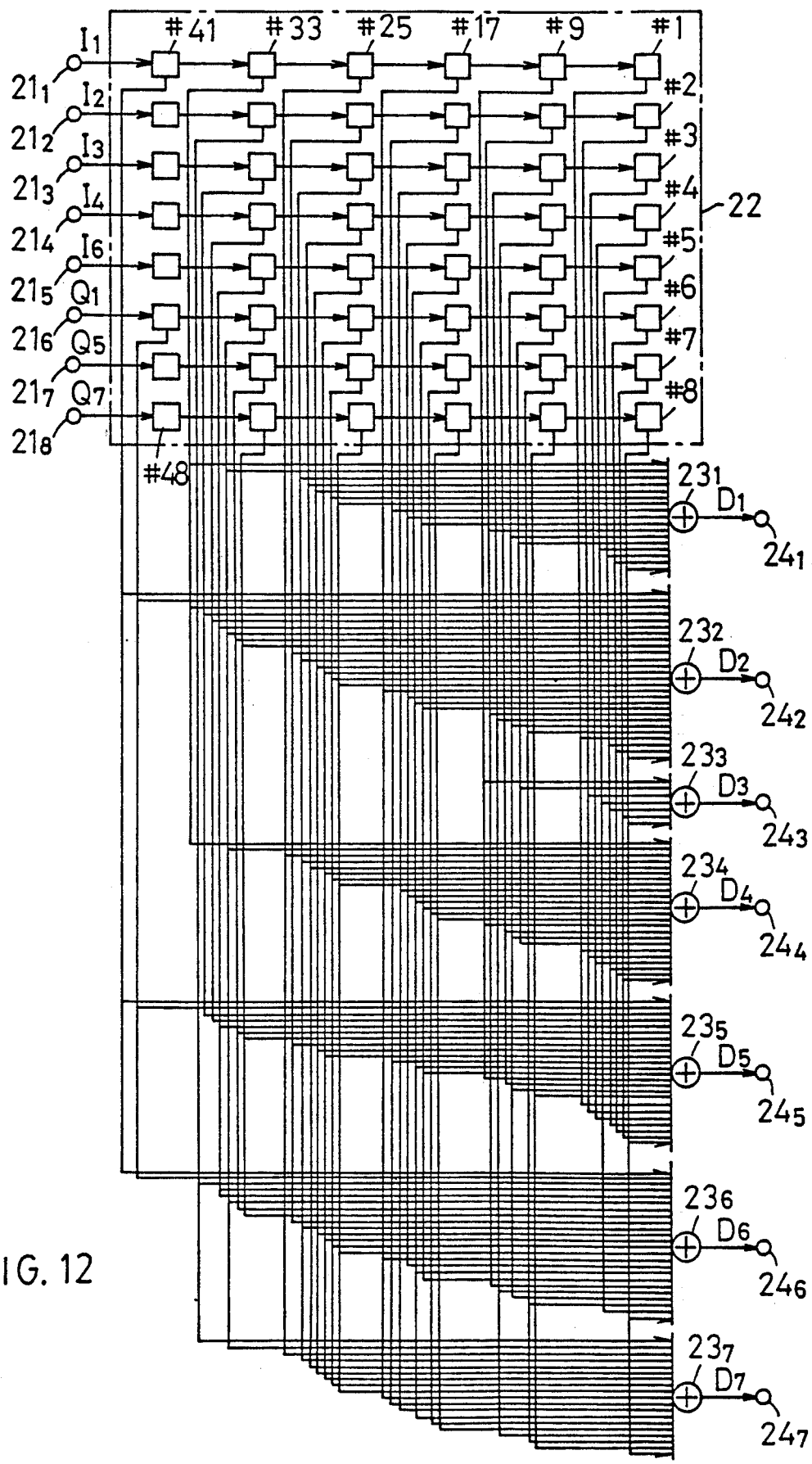
FIG. 12 is a circuit diagram illustrating an embodiment of a simple decoder constructed in accordance with coefficients of decoding generative polynomials obtained from the inverse matrix depicted in FIG. 11.

In the inverse matrix of FIG. 11, any of three consecutive rows starting at arbitrary rows, respectively, provides a set of coefficient solutions of decoding generative polynomials. FIG. 12 illustrates a simple decoder constructed in accordance with coefficients in the uppermost seven rows in the row group $L_a$, for instance. As in the case of FIG. 8, the positions of coefficients "1's" in the first to seventh rows of the row group $L_a$ represent the numbers of those of the shift stages #1 to #48 which are to be connected to modulo-2 addition circuits $23_1$ to $23_7$. With this simple decoder, the original data $D_1$ to $D_7$ are decoded and output from the modulo-2 addition circuits $23_1$ to $23_7$ in the state in which encoded data of the first 48 bits are being held in the shift stages #1 to #48, and thereafter 7-bit original data is decoded each time input encoded data is provided by eight bits. It is apparent that the simple decoder of FIG. 11 can also be modified to the construction wherein all the shift stages are connected in series as in the case of FIG. 9.

In general, it is necessary that the number of all data bits, $N=mx$, which must be held in the shift register 22 in the simple decoder for convolutional codes with constraint length K and coding rate $R=n/m$, satisfy the following expression as in the case of Eq. (3).

$$mx \geq K+n-1+n(x-1) \qquad (8)$$

Hence, the number of columns (the number of shift stages of each of the shift registers $SR_1$ to $SR_4$ in the FIG. 8 embodiment, for example) x needs only to be an integer which satisfies the following expression.

$$x \geq (K-1)/(m-n) \qquad (9)$$

The required number, N, of shift stages of the shift register circuit 22 is given by the following expression.

$$N=xm \geq m(K-1)/(m-n) \qquad (10)$$

To reduce the construction of the simple decoder, it is preferable that the value of x be selected small, and in such an instance the following equation can be used to determine the value of x.

$$x=\lceil (K-1)/(m-n) \rceil \qquad (11)$$

In this case, the symbol [p] represents the minimum integer equal to or greater than a real number p. In the case where $(K-1)/(m-n)$ does not provide an integer in the above Expressions (9) and (10), it is also possible to use, as a substitute for m, a maximum integer m' which makes $(K-1)/(m-n)$ an integer but does not exceed m. Usually, if the integer m' is selected to be equal to n+1, the value of x in Eq. (9) always become an integer regardless of the value of constraint length K. That is, xm' generating polynomials are obtained by the procedure in which m'=n+1 polynomials are selected from m convolutional code generating polynomials such as given by Eq. (1) and m' generating polynomials are increased upon each addition of n-bit data as in the above, and an mx by mx square matrix A is obtained which uses, as its elements, coefficients of such polynomials. In this case, the number x of shift stages of one row in the shift register circuit 22 is K−1. In any of the methods, when the determinant of the code generating matrix A thus obtained becomes zero, it is impossible to obtain the inverse matrix $B=A^{-1}$. In such a case, there is the possibility of obtaining the inverse matrix, if other values of x are selected which satisfy Exp. (9).

Thus, according to the present invention, the simple decoder with an arbitrary coding rate n/m, which is unobtainable with the prior art, can easily be implemented by a shift register circuit and logic circuits as shown in FIGS. 8, 9 and 12, for instance.

Figure 1:
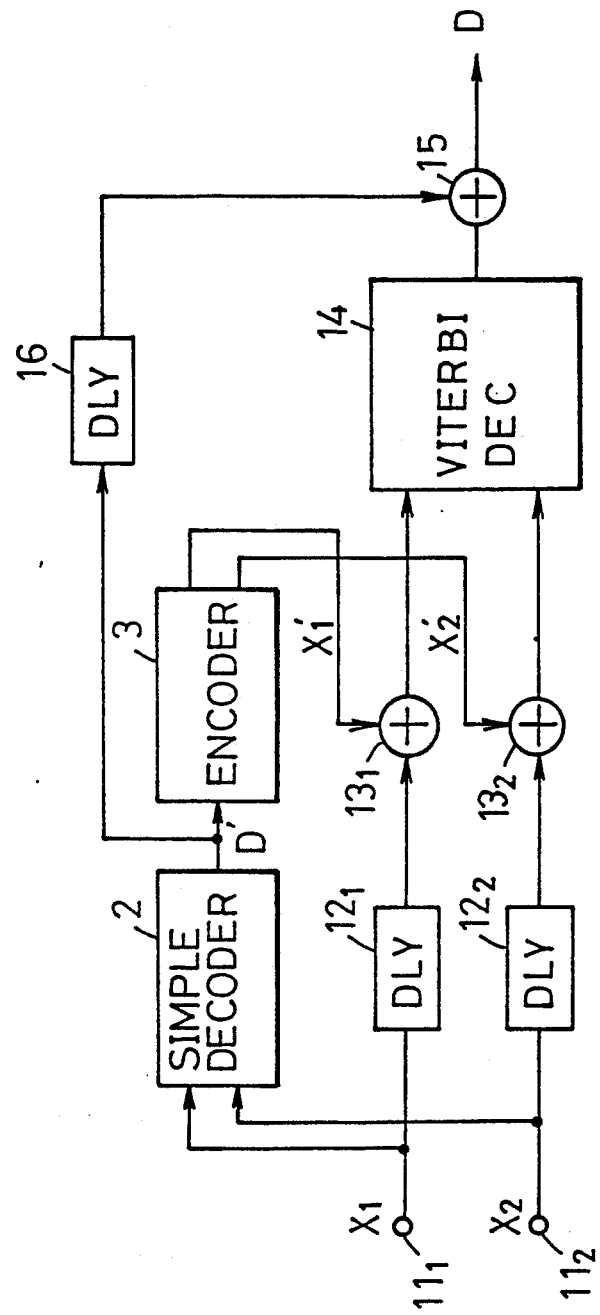
FIG. 1 is a block diagram showing the construction of a conventional SST type Viterbi decoder.
Figure 2:
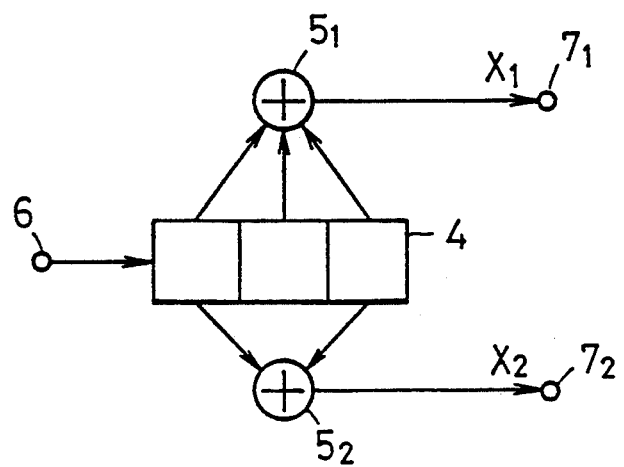
FIG. 2 is a schematic diagram showing an encoder with coding rate R=½ and constraint length K=4.
Figure 3:
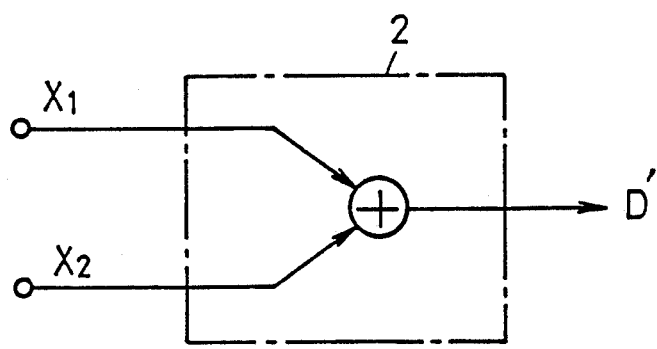
FIG. 3 is a schematic diagram of a simple decoder corresponding to the encoder of FIG. 2.
Figure 13:
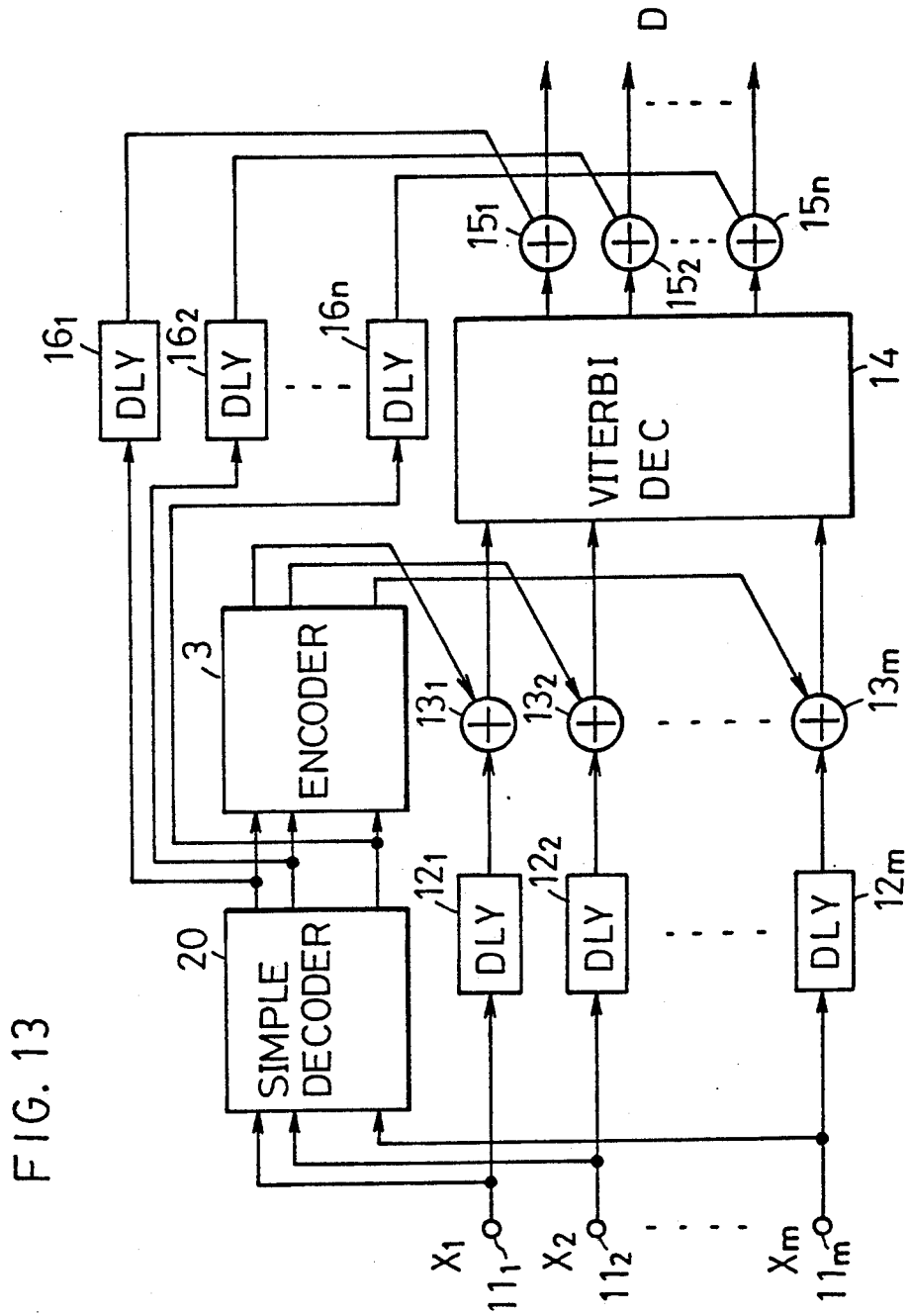
FIG. 13 is a block diagram illustrating the construction of an SST type Viterbi decoder employing the simple decoder of the present invention.

FIG. 13 illustrates, as an example of application of the invention, the construction of an SST type Viterbi decoder with coding rate n/m which employs the simple decoder as in the case of FIG. 1. The n-bit original data D is estimated, by a simple decoder 20 with coding rate n/m according to the present invention, from m-bit received convolutionally encoded data (soft decision data) $X_1$ to $X_m$ which may contain channel errors. Then, n-bit estimated original data D' is re-encoded by an encoder 3 of the same construction as that of the convolutional encoder at the transmitting side, and the re-encoded convolutional codes and the received convolutional codes $X_1$ to $X_m$ are compared by comparators (exclusive-OR circuits) $13_1$ to $13_m$. A bit pattern abnormality caused by the channel errors, thus detected, is input into a narrow-sense Viterbi decoder 14 to decode the corresponding errors in the estimated data D'. The errors in the estimated data D', thus obtained, and the estimated original data D' output from the simple decoder 20 are subjected to modulo-2 addition by modulo-2 addition circuits $15_1$ to $15_m$, thereby correcting the errors in the estimated original data D' to obtain n-bit ultimate decoded data D.

Figure 14:
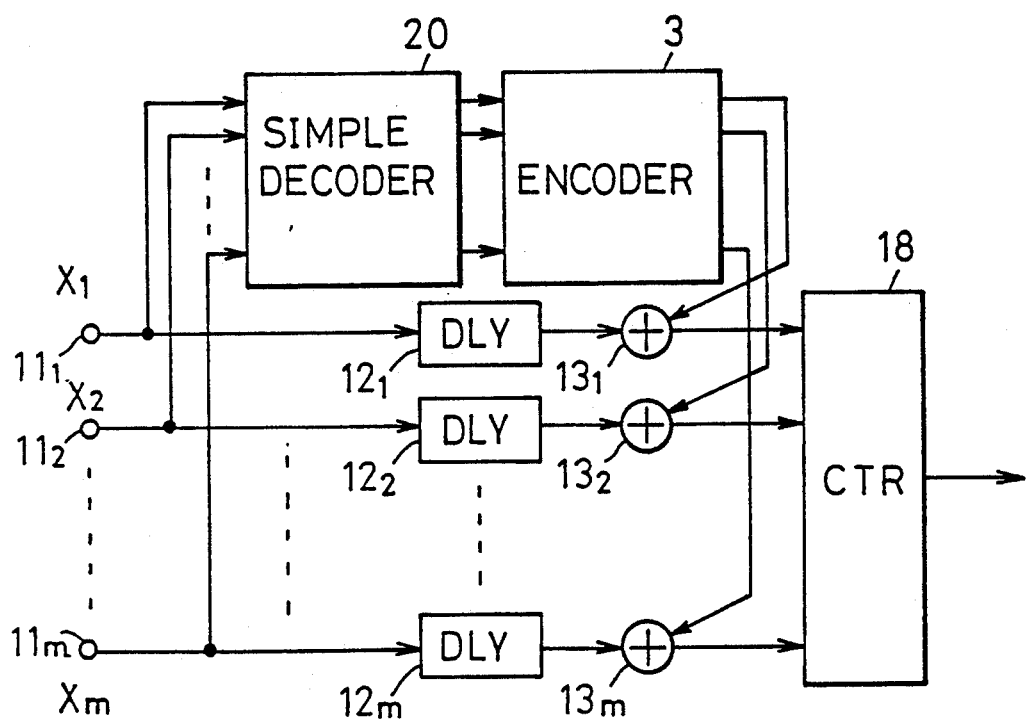
FIG. 14 is a block diagram illustrating the construction of a channel error measuring apparatus employing the simple decoder of the present invention.

FIG. 14 illustrates, as another example of application of the present invention, the construction of a transmission channel code error measuring apparatus called a bar monitor, for monitoring the line quality. Received coded data of coding rate n/m from the transmission line is provided to terminals $11_1$ to $11_m$, and as in the case of FIG. 13, the n-bit original data is estimated and decoded by a simple decoder 20 with no error-correcting capability according to the present invention. The decoded results are re-encoded by an encoder 3 of the same construction as that of the encoder at the transmitting side, as in the case of FIG. 13, and the re-encoded data are provided to comparators $13_1$ to $13_m$. On the other hand, the received m-bit encoded data from the terminals $11_1$ to $11_m$ are also provided to the comparators $13_1$ to $13_m$ via delay circuits $12_1$ to $12_m$ which match the timing of the data, and they are compared with the re-encoded data. If the received m-bit encoded data have no channel error, then they match the re-encoded data and the outputs from the comparators $13_1$ to $13_m$ are all "0's". If a channel error is contained in the received encoded data, an abnormality occurs in the corresponding bit pattern, a mismatch is caused between the received encoded data and the re-encoded data, the comparator which has detected the mismatch outputs a "1" and the number of "1's" indicating such mismatches is counted by a counter 18. The counter 18 outputs an evaluation value indicative of the line quality after calculating it on the basis of its count value of mismatches.

As described above, the present invention permits the implementation of a simple decoder capable of decoding convolutional codes of a predetermined arbitrary coding rate n/m. By applying the simple decoder to the SST Viterbi decoder, the narrow-sense Viterbi decoder used therein will mainly decode an error series. Since the quantity of error series in the transmission line is far smaller than the quantity of information of original data series, power dissipation of the Viterbi decoder can be drastically reduced by using a CMOS circuit to form the narrow-sense Viterbi decoder. Moreover, since the Viterbi decoder needs only to decode the error series, it is considered that its state centers on "0, 0." Hence, even if the Viterbi decoder has a construction which specifies a certain path memory series without providing a maximum likelihood decision circuit and derives a decoded output from its output, no large error will be induced. Thus, the maximum likelihood decision circuit can be omitted and the circuit scale can be reduced accordingly.

It will be apparent that many modifications and variations may be effected without departing from the scope of the novel concepts of the present invention.

What is claimed is:

1. A simple decoder which decodes convolutional codes of constraint length K and coding rate $R=n/m$, generated by the modulo-2 addition of data selected from original data of consecutive $K+n-1$ bits in accordance with coupling coefficients of m code generating vectors each composed of predetermined $K+n-1$ coupling coefficients, where K, n and m are natural numbers, K being larger than 1 and m being larger than n, said simple decoder comprising:

m shift registers each supplied with one bit of sequentially received m-bit data of said convolutional codes and having x series-connected shift stages, where x is a predetermined integer which satisfies $x \geq (K-1)/(m-n)$, a total of $N=mx$ shift stages of said m shift registers forming a shift register circuit for storing N pieces of encoded data;

n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder; and n-modulo-2 addition circuit means connected to said n selective coupling means, each for performing modulo-2 additions of outputs in a corresponding one of said n groups selected from said plurality of shift stages;

said decoding generative matrix being an inverse matrix of a square matrix whose elements are $N \times N$ coefficients of N code generating polynomials which generates $N=mx$ codes produced using m code generating vectors of said encoder.

2. A simple decoder which decodes convolutional codes of constraint length K and coding rate $R=n/m$, generated by the modulo-2 addition of data selected from original data of consecutive $K+n-1$ bits in accordance with coupling coefficients of m code generating vectors each composed of predetermined $K+m-1$ coupling coefficients, where K, n and m are natural numbers, K being larger than 1 and m being larger than n, said simple decoder comprising:

a shift register supplied with received data of said convolutional codes on a bitwise basis and having N series-connected shift stages, where N is an integer which satisfies $N \geq m(K-1)/(m-n)$, said N shift stages constituting a shift register circuit for holding N pieces of N encoded data;

n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder; and n modulo-2 addition circuit means connected to said n selective coupling means, each for performing modulo-2 addition of outputs in a corresponding one of said n groups selected from said plurality of shift stages;

said decoding generative matrix being an inverse matrix of a square matrix whose elements are $N \times N$ coefficients of N code generating polynomials for generating N codes, produced using m code generating vectors of said encoder with respect to consecutive $K+n-1$ bits of original data input into said encoder every n bits.

3. A simple decoding method for receiving and decoding successive bits of convolutional codes of constraint length K and coding rate $R=n/m$, generated by repeating, for each input of original data into an encoder while shifting said original data by steps of n bits, an operation of outputting m-bit encoded data by the modulo-2 addition of each of data selected from consecutive $K+n-1$ bits of said original data input into said encoder in accordance with predetermined $K+n-1$ coupling coefficients, respectively, where K, n and m are natural numbers, K being larger than 1 and m being larger than n, said method comprising the steps of:

holding the most recent consecutive N bits of said convolutional codes received by steps of m bits, where N is a predetermined integer which satisfies $N \geq m(K-1)/(m-n)$;

delivering n groups of output bits selected from said N bits in accordance with n corresponding sets of coupling coefficients each set of which are N elements in a corresponding one of n consecutive rows selected from a decoding generative matrix corresponding to the code generating vectors of said encoder; and performing the modulo-2 addition of said selected data in each of n groups and outputting n-bit decoded data;

wherein said decoding generative matrix is an inverse matrix of a square matrix whose elements are $N \times N$ coefficients of N code generating polynomials for generating N codes, produced using m code generating vectors of said encoder with respect to consecutive $K+n-1$ bits of original data output into said encoder every n bits.

4. A method of forming a simple decoder which decodes convolutional codes of constraint length K and coding rate $R=n/m$, generated by repeating, for each input of original data into an encoder while shifting said original data by steps of n bits, an operation of outputting m-bit encoded data by the modulo-2 addition of each of data selected from consecutive $K+n-1$ bits of said original data input into said encoder in accordance with predetermined $K+n-1$ coupling coefficients, respectively, where K, n and m are natural numbers, K being larger than 1 and m being larger than n, said method comprising:

a step of obtaining x sets of m-bit encoded data by repeating the generation of m-bit encoded data through use of m code generating vectors with respect to said original data of the most recent consecutive K+n−1 bits input each time said original data is input by steps of n bits, where x is a predetermined integer which satisfies x≧(K−1)/(m−n);

a step of obtaining N code generating polynomials each having N coupling coefficients, by representing each of m code generating polynomials for generating m-bit encoded data of each of said sets by N=xm coupling coefficients including said (K+n−1) coupling coefficients of a corresponding one of said m code generating vectors;

a step of forming an N by N code generating matrix whose elements in each row are said N coupling coefficients of corresponding one of N code generating polynomials;

a step of obtaining an inverse matrix from said code generating matrix; and a step wherein N shift stages, into which said convolutional codes are input, and each of n modulo-2 addition circuits are selectively connected in accordance with N coupling coefficients which are N elements of corresponding one of n consecutive rows selected from said inverse matrix.

5. The simple decoder of claim 1 wherein the value of said x is given by the following equation $$x = \lceil (K-1)/(m-n) \rceil,$$

(where a symbol [p] represents the minimum integer equal to or greater than a real number p).

6. The simple decoder of claim 2 wherein the value of said N is given by the following equation $$N = m \lceil (K-1)/(m-n) \rceil,$$

(where a symbol [p] represents the minimum integer equal to or greater than a real number p).

7. The simple decoding method of claim 3 wherein the value of said N is given by the following equation $$N = m \lceil (K-1)/(m-n) \rceil,$$

(where a symbol [p] represents the minimum integer equal to or greater than a real number p).

8. The decoder forming method of claim 4 wherein the value of said x is given by the following equation $$x = \lceil (K-1)/(m-n) \rceil,$$

(where a symbol [p] represents the minimum integer equal to or greater than a real number p).

9. The simple decoder of claim 1 or 2 wherein a structure in which K=4, R=n/m=½ and the vector of said row selected from said decoding generative matrix is (11), a structure in which K=7, R=n/m=½ and the vector of said row selected from said decoding generative matrix is (1110111010), and a structure in which K=7, R=n/m=¾ and the vectors of said rows selected from said decoding generative matrix are (110111011100110110100000), (101000010001011110100000) and (000100010111101000000000) are omitted.

10. The simple decoding method of claim 3 wherein a structure in which K=4, R=n/m=½ and the vector of said row selected from said decoding generative matrix is (11), a structure in which K=7, R=n/m=½ and the vector of said row selected from said decoding generative matrix is (1110111010) and a structure in which K=7, R=n/m=¾ and the vectors of said rows selected from said decoding generate matrix are (110111011100110110100000), (101000010001011110100000) and (000100010111101000000000) are omitted.

11. A decoder system comprising:

a simple decoder for decoding received convolutional codes to obtain estimated original data, said convolutional codes being of constraint length K and coding rate R=n/m, generated by the modulo-2 addition of data selected from original data of consecutive K+n−1 bits in accordance with coupling coefficients of m code generating vectors each composed of predetermined K+n−1 coupling coefficients, where K, n and m are natural numbers, K being larger than 1 and m being larger than n, said simple decoder comprising m shift registers each supplied with one bit of sequentially received m-bit data of said convolutional codes and having x series-connected shift stages, where x is a predetermined integer which satisfies x≧(K−1)/(m−n), a total of N=mx shift stages of said m shift registers forming a shift register circuit for storing N pieces of encoded data; n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder, and n modulo-2 addition circuit means connected to said n selective coupling means, each for performing modulo-2 additions of outputs in a corresponding one of said n groups selected from said plurality of shift stages; said decoding generative matrix being an inverse matrix of a square matrix whose elements are N×N coefficients of N code generating polynomials which generates N=mx codes produced using m code generating vectors of said encoder;

an encoder of the same construction as that of an encoder at the transmitting side, for re-encoding estimated original data from said simple decoder by convolution;

compare means for comparing said received encoded data and said re-encoded data by an exclusive OR operation therebetween;

a Viterbi decoder for decoding an estimated error from the results of comparison by said compare means; and modulo-2 addition circuit means for correcting said estimated error of said estimated original data by performing a modulo-2 addition of said estimated original data from said simple decoder and said estimated error from said Viterbi decoder.

12. A transmission line quality monitoring apparatus comprising:

a simple decoder for obtaining estimated original data by decoding received convolutional codes, said convolution codes being of constraint length K and coding rate R=n/m, generated by the modulo-2 addition of data selected from original data of consecutive K+n−1 bits in accordance with coupling coefficients of m code generating vectors each composed of predetermined K+n−1 coupling coefficients, where K, n and m are natural numbers, K being larger than 1 and m being larger than n, said simple decoder comprising m shift registers each supplied with one bit of sequentially received m-bit data of said convolutional codes and having x series-connected shift stages, where x is a predetermined integer which satisfies $x \geq (K-1)/(m-n)$, a total of $N=mx$ shift stages of said m shift registers forming a shift register circuit for storing N pieces of encoded data; n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder; and n modulo-2 addition circuit means connected to said n selective coupling means, each for performing modulo-2 additions of outputs in a corresponding one of said n groups selected from said plurality of shift stages; said decoding generative matrix being an inverse matrix of a square matrix whose elements are $N \times N$ coefficients of N code generating polynomials which generates $N=mx$ codes produced using m code generating vectors of said encoder;

a convolutional encoder of the same construction as that of an encoder at the transmitting side, for re-encoding said estimated original data from said simple decoder by convolution;

compare means for comparing said received encoded data and said re-encoded data by an exclusive OR operation therebetween to detect a mismatch; and counter means for counting the number of mismatches detected by said compare means and for outputting an evaluation value corresponding to the count value.

13. A decoder system comprising:

a simple decoder for decoding received convolutional codes to obtain estimated original data, said convolutional codes being of constraint length K and coding rate $R=n/m$, generated by the modulo-2 addition of data selected from original data of consecutive $K+n-1$ bits in accordance with coupling coefficients of m code generating vectors each composed of predetermined $K+n-1$ coupling coefficients, where K, n and m are natural numbers, K being larger than 1 and m being larger than n, said simple decoder comprising a shift register supplied with received data of said convolutional codes on a bitwise basis and having N series-connected shift stages, where N is an integer which satisfies $N \geq m(K-1)/(m-n)$, said N shift stages constituting a shift register circuit for holding N pieces of N encoded data; n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder; and n modulo-2 addition circuit means connected to said n selective coupling means, each for performing modulo-2 addition of outputs in a corresponding one of said n groups selected from said plurality of shift stages; said decoding generative matrix being an inverse matrix of a square matrix whose elements are $N \times N$ coefficients of N code generating polynomials for generating N axes, produced using m code generating vectors of said encoder with respect to consecutive $K+n-1$ bits of original data input into said encoder every n bits;

an encoder of the same construction as that of an encoder at the transmitting side, for re-encoding estimated original data from said simple decoder by convolution;

compare means for comparing said received encoded data and said re-encoded data by an exclusive OR operation therebetween;

a Viterbi decoder for decoding an estimated error from the results of comparison by said compare means; and modulo-2 addition circuit means for correcting said estimated error of said estimated original data by performing a modulo-2 addition of said estimated original data from said simple decoder and said estimated error from said Viterbi decoder.

14. A transmission line quality monitoring apparatus comprising:

a simple decoder for obtaining estimated original data by decoding received convolutional codes being of constraint length K and coding rate $R=n/m$, generated by the modulo-2 addition of data selected from original data of consecutive $K+n-1$ bits in accordance with coupling coefficients of m code generating vectors each composed of predetermined $K+m-1$ coupling coefficients, where K, n and m are natural numbers, K being larger than 1 and m being larger than n, said simple decoder comprising a shift register supplied with received data of said convolutional codes on a bitwise basis and having N series-connected shift stages, where N is an integer which satisfies $N \geq m(K-1)/(m-n)$, said N shift stages constituting a shift register circuit for holding N pieces of N encoded data; n selective coupling means each for delivering the outputs from a plurality of stages selected from said N shift stages in accordance with a corresponding one of n sets of coupling coefficients each set of which are N elements in a corresponding one of n consecutive rows selected from a decoding generative matrix corresponding to a code generating vector of said encoder; and n modulo-2 addition circuit means connected to said n selective coupling means, each for performing modulo-2 addition of outputs in a corresponding one of said n groups selected from said plurality of shift stages; said decoding generative matrix being an inverse matrix of a square matrix whose elements are $N \times N$ coefficients of N code generating polynomials for generating N axes, produced using m code generating vectors of said encoder with respect to consecutive $K+n-1$ bits of original data input into said encoder every n bits;

a convolutional encoder of the same construction as that of an encoder at the transmitting side, for re-encoding said estimated original data from said simple decoder by convolution;

compare means for comparing said received encoded data and said re-encoded data by an exclusive OR operation therebetween to detect a mismatch; and counter means for counting the number of mismatches detected by said compare means and for outputting an evaluation value corresponding to the count value.

* * * * *